United States Patent
Sasaki

(10) Patent No.: US 11,496,216 B2
(45) Date of Patent: Nov. 8, 2022

(54) OPTICAL COMMUNICATION SYSTEM

(71) Applicant: JOLED INC., Tokyo (JP)

(72) Inventor: Atsushi Sasaki, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 17/421,144

(22) PCT Filed: Jan. 8, 2020

(86) PCT No.: PCT/JP2020/000325
§ 371 (c)(1),
(2) Date: Jul. 7, 2021

(87) PCT Pub. No.: WO2020/145311
PCT Pub. Date: Jul. 16, 2020

(65) Prior Publication Data
US 2022/0060258 A1    Feb. 24, 2022

(30) Foreign Application Priority Data

Jan. 11, 2019 (JP) .............................. JP2019-003379

(51) Int. Cl.
*H04B 10/00* (2013.01)
*H04B 10/116* (2013.01)

(52) U.S. Cl.
CPC .................................. *H04B 10/116* (2013.01)

(58) Field of Classification Search
CPC ............. H04B 10/116; H04B 10/1141; G06K 7/10722; G06K 7/1417; G06K 19/06112; G06K 19/06037
See application file for complete search history.

(56) References Cited

U.S. PATENT DOCUMENTS

| | | | |
|---|---|---|---|
| 8,823,852 B2 | 9/2014 | Yamada et al. | |
| 2010/0034540 A1 | 2/2010 | Togashi | |
| 2013/0330088 A1 | 12/2013 | Oshima et al. | |
| 2016/0164606 A1* | 6/2016 | Liu | H04B 10/60 398/118 |

(Continued)

FOREIGN PATENT DOCUMENTS

| | | |
|---|---|---|
| EP | 2473002 | 7/2012 |
| JP | 2005-151015 | 6/2005 |

(Continued)

OTHER PUBLICATIONS

International Search Report (ISR) from International Searching Authority (Japan Patent Office) in International Pat. Appl. No. PCT/JP2020/000325, dated Mar. 17, 2020, along with an English language translation.

*Primary Examiner* — Pranesh K Barua
(74) *Attorney, Agent, or Firm* — Greenblum & Bernstein, P.L.C.

(57) ABSTRACT

The optical communication system includes a transmitter including a display panel which has a curved surface and is capable of emitting light, and a transmission controller which causes the display panel to emit light representing an information signal; and a receiver including an image sensor which receives the light emitted from the display panel, and a reception controller which extracts the information signal from the light received by the image sensor. The display panel may be a transparent display panel which allows background light to pass through.

15 Claims, 13 Drawing Sheets

(56) References Cited

U.S. PATENT DOCUMENTS

| | | |
|---|---|---|
| 2016/0166153 A1 | 6/2016 | Woo et al. |
| 2016/0191157 A1* | 6/2016 | Yamasaki ............ H04B 10/116 |
| | | 398/118 |
| 2016/0191159 A1 | 6/2016 | Aoyama et al. |
| 2016/0359563 A1* | 12/2016 | Harbers ................. H05B 45/37 |
| 2017/0092177 A1 | 3/2017 | Kobayashi et al. |
| 2017/0124368 A1* | 5/2017 | Jang ..................... G06K 7/1413 |
| 2017/0132809 A1 | 5/2017 | Hiroki et al. |
| 2019/0244563 A1* | 8/2019 | Kishimoto ............ G06F 1/1632 |
| 2021/0365035 A1* | 11/2021 | Verbrugh ............. G05D 1/0234 |

FOREIGN PATENT DOCUMENTS

| | | |
|---|---|---|
| JP | 2005151015 A * | 6/2005 |
| JP | 2007-157487 | 6/2007 |
| JP | 2008-252570 | 10/2008 |
| JP | 2010-212920 | 9/2010 |
| JP | 2012-142203 | 7/2012 |
| JP | 2012-178764 | 9/2012 |
| JP | 2013-211169 | 10/2013 |
| JP | 2014-093700 | 5/2014 |
| JP | 2015-216667 | 12/2015 |
| JP | 2017-062474 | 3/2017 |
| JP | 2017-091140 | 5/2017 |
| JP | 2018-032885 | 3/2018 |
| JP | 2018-509943 | 4/2018 |
| WO | 2016/100145 | 6/2016 |

\* cited by examiner

OPTICAL COMMUNICATION SYSTEM

TECHNICAL FIELD

The present disclosure relates to an optical communication system.

BACKGROUND ART

There are optical communication systems in which communication is performed by radiating light modulated by an information signal from a light emitter such as a lighting apparatus or a display and receiving the light by a light receiving element or a camera.

CITATION LIST

Patent Literature

[PTL 1] Japanese Unexamined Patent Application Publication No. 2005-151015

SUMMARY OF INVENTION

Technical Problem

In the case where an optical communication system is installed in a moving body such as a vehicle, the place for installation of the light emitter is limited due to a complicated shape of the outer surface of the moving body and a large area of windows made of a transparent material. This leads to difficulties in increasing the area of the light emitting portion.

Accordingly, the object of the present disclosure is to provide an optical communication system which enables relaxation of limitations on the place for installation of the light emitter.

Solution to Problem

To achieve the above object, the optical communication system according to one aspect of the present disclosure includes a transmitter including a display panel which has a curved surface and is capable of emitting light, and a transmission controller which causes the display panel to emit light representing an information signal; and a receiver including an image sensor which receives the light emitted from the display panel, and a reception controller which extracts the information signal from the light received by the image sensor.

In such a configuration, the light emitter is configured of a display panel having a curved surface, and thus such a light emitter is readily disposed even in portions having complicated shapes in the outer surface of the moving body. This configuration results in an optical communication system which enables relaxation of the limitations on the place for installation of the light emitter.

Moreover, the transmission controller may cause the display panel to display an image of a predetermined shape, and based on a difference between the predetermined shape and a shape of the image captured by the image sensor, the reception controller may determine whether a region of the display panel in which the image is displayed faces the image sensor.

Moreover, the reception controller may extract the information signal only from the image displayed in the region of the display panel determined to face the image sensor.

Such a configuration enables directive communication between the region and the image sensor facing the region for each region of the display panel having a curved shape, and thus enables space division multiplexing communication between one transmitter and a plurality of receivers based on directivity.

The optical communication system according to one aspect of the present disclosure includes a transmitter including a display panel which is capable of emitting light and allows background light to pass through, and a transmission controller which causes the display panel to emit light representing an information signal; and a receiver including an image sensor which receives the light emitted from the display panel, and a reception controller which extracts the information signal from the light received by the image sensor.

In such a configuration, the light emitter is configured of a transparent and less visible display panel, and thus such a light emitter is readily disposed even in design-oriented portions of the outer surface of the moving body. This configuration results in an optical communication system which enables relaxation of the limitations on the place for installation of the light emitter.

Moreover, the transmitter may be provided to a moving body, and the display panel may be disposed above a transparent member which constitutes an outer surface of the moving body.

Such a configuration enables original light, which passes through the transparent member, to also pass through the display panel. Thus, the display panel can be installed, for example, in places including window glass and a directional indicator lens where a display panel having light shielding properties cannot be disposed.

Moreover, the display panel may include a first display panel and a second display panel which are layered in a light radiating direction and allow background light to pass through.

In such a configuration, the light emitter can be doubled to enhance reliability, without increasing the substantial installation area.

Moreover, the transmission controller may cause the first display panel and the second display panel to alternately emit light.

Such a configuration can prolong the entire life of the light emitters included in the first display panel and the second display panel.

Moreover, the display panel may be an organic electroluminescent (EL) display panel.

Such a configuration provides an optical communication system which has a small thickness and a light weight, and is advantageously mounted on a moving body, for example, by using an organic EL display panel which can be driven at low electricity by use of high-speed response.

Moreover, the transmitter may be provided to a moving body, the organic EL display panel may be fixed to a member which constitutes an outer surface of the moving body, and an entire surface of the organic EL display panel and at least part of the member may be covered with a transparent resin.

In such a configuration, the member which constitutes the outer surface of the moving body can be integrally formed with the organic EL display panel by utilizing the small thickness of the organic EL display panel. Thus, an optical communication system which hardly impairs the designability of the appearance of the moving body is provided.

Moreover, the member may include a through hole in a position corresponding to a rear surface of the organic EL display panel, and the organic EL display panel may be connected to the transmission controller with a cable which extends through the through hole.

Such a configuration facilitates extension of the cable which connects the organic EL display panel to the transmission controller, thus providing an optical communication system having excellent mount properties.

Moreover, the transmission controller may temporally change intensity of the light emitted by the display panel according to the information signal.

In such a configuration, communication can be performed by modulating the intensity of the light with the information signal.

Moreover, the display panel may be a color display panel which is capable of emitting visible light of a color, and the transmission controller may temporally change the color of the visible light emitted by the display panel according to the information signal.

In such a configuration, communication can be performed by modulating the color of the visible light with the information signal.

Moreover, the transmission controller may cause the display panel to display a two-dimensional code representing the information signal in a two-dimensional array including pixels which emit light and pixels which do not emit light.

In such a configuration, communication can be performed by displaying the two-dimensional code representing the information signal using light.

Moreover, the transmission controller may periodically invert emission and non-emission of light from the pixels in the display panel, the pixels constituting the two-dimensional code.

Such a configuration can level the degree of degradation of the pixels which progresses according to the light emission time, and thus can prolong the effective life of the display panel.

Moreover, the optical communication system may further include a cleaner disposed in the light radiating direction of the display panel.

Moreover, the cleaner may be a wiper disposed on the light radiating surface of the display panel.

Such a configuration can remove dirt which obstructs recognition of the light radiated from the display panel, facilitating ensuring of the reliability of communication.

Moreover, the transmitter may be disposed in a first vehicle, and the receiver may be disposed in a second vehicle.

Such a configuration results in an optical communication system which performs communication between the vehicles.

Moreover, the transmitter may be disposed in a first drone, and the receiver may be disposed in a second drone.

Such a configuration results in an optical communication system which performs communication between the drones.

Moreover, one of the transmitter and the receiver may be disposed in a drone, and the other thereof may be disposed in an airship.

Such a configuration results in an optical communication system which performs communication between the drone and the airship.

Moreover, the transmitter may further include a wireless communicator which transmits a signal using radio waves.

Moreover, the optical communication system according to one aspect of the present disclosure may further include an image capturer including an image sensor for image capturing which captures an image and an image capturing controller which controls the image sensor for image capturing.

Moreover, the image capturer may further include a switch for starting and stopping an operation of the image capturer.

Such a configuration can reduce a risk of invading the privacy by obtaining unnecessary images.

Advantageous Effects of Invention

Because the optical communication system according to according to the present disclosure includes a display panel having a curved surface or a display panel which allows background light to pass through, as the light emitter, an optical communication system which enables relaxation of the limitations on the place for installation of the light emitter can be obtained.

DESCRIPTION OF EMBODIMENTS

A plurality of embodiments according to the present disclosure will be described in detail with reference to the drawings. The embodiments described below all illustrate comprehensive or specific examples. Numeric values, shapes, materials, components, arrangements of components, and connection forms thereof shown in the following embodiments are exemplary, and should not be construed as limitations to the present disclosure.

Embodiment 1

The optical communication system according to Embodiment 1 will be described by way of an example of a visible optical communication system including a display panel, as a light emitter, which is transparent and has a curved surface. In this specification, the term "transparent" indicates that background light is passed through, and the term "curved surface" indicates a non-planar shape.

Figure 1:
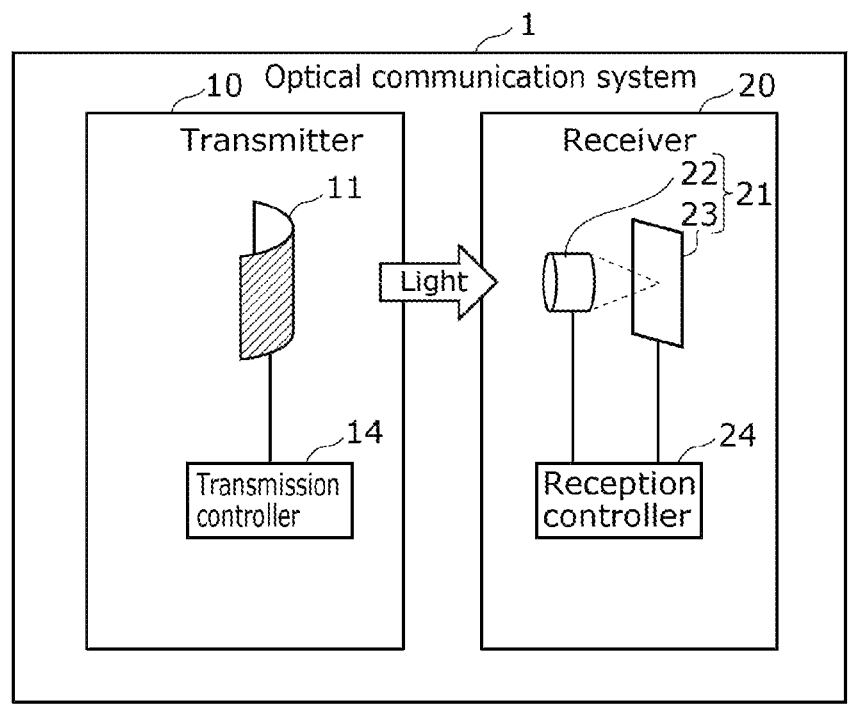
FIG. 1 is a block diagram illustrating one example of a functional configuration of the optical communication system according to Embodiment 1.

FIG. 1 is a block diagram illustrating one example of the functional configuration of the optical communication system according to the present embodiment. As illustrated in FIG. 1, the optical communication system includes transmitter 10 including display panel 11 and transmission controller 14, and receiver 20 including image sensor 21 and reception controller 24.

Display panel 11 is a transparent display panel which has a curved surface and is capable of emitting light. As one example, display panel 11 may be an organic electroluminescent (EL) display panel which displays a visible light image. For example, a transparent organic EL display panel having a curved surface includes a flexible substrate made of a transparent resin and a laminate which is disposed on the substrate and includes a cathode, an electron transport layer, a light emitting layer, a hole transport layer, and an anode made of transparent materials.

Transmission controller 14 obtains an information signal from an application apparatus (not illustrated) which includes the optical communication system according to the present embodiment, and causes display panel 11 to emit visible light representing an information signal. As one example, transmission controller 14 may be configured with a one-chip microcomputer including a processor, a memory, and an input/output port, and the functions of transmission controller 14 may be implemented by the processor which executes programs recorded on the memory.

Image sensor 21 receives the light emitted from display panel 11. As one example, image sensor 21 may be a camera including optical system 22 and image capturing element 23.

Reception controller 24 extracts the information signal, which is represented by the light, from the light received by image sensor 21, and feeds the extracted information signal to the application apparatus not illustrated. As one example, reception controller 24 may be configured with a one-chip microcomputer including a processor, a memory, and an input/output port, and the functions of reception controller 24 may be implemented by the processor which executes programs stored in the memory.

Figure 2:
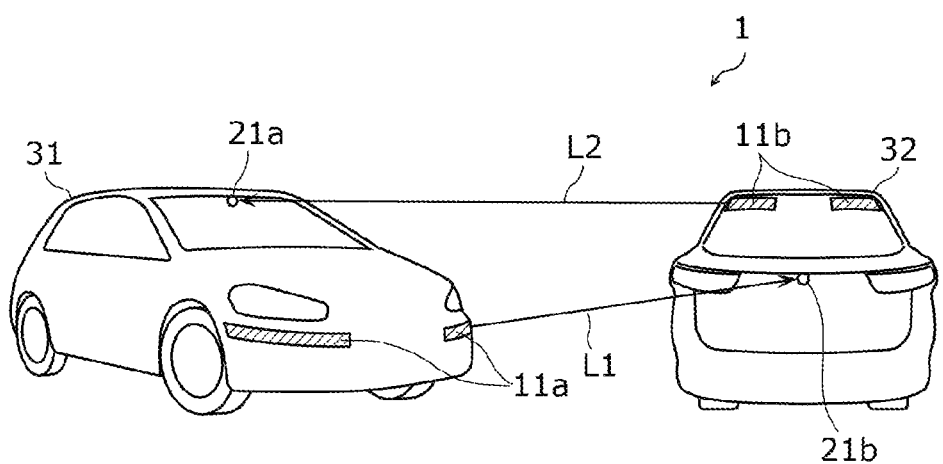
FIG. 2 is a schematic view illustrating an application example of the optical communication system according to Embodiment 1.

FIG. 2 is a schematic view illustrating an application example of optical communication system 1 applied to communication between vehicles 31 and 32. As illustrated in FIG. 2, vehicle 31 includes display panels 11a and image sensor 21a, and vehicle 32 includes display panels 11b and image sensor 21b.

Display panels 11a and 11b are transparent organic EL display panels having a curved surface, and display images formed by visible light L1 and visible light L2, respectively. Display panels 11a and 11b are disposed above the front directional indicator lenses of vehicle 31 and on the rear window glass of vehicle 32, respectively.

Image sensors 21a and 21b are vehicle-installed cameras, and capture images ahead vehicle 31 and behind vehicle 32, respectively. Image sensors 21a and 21b are disposed inside vehicle 31 and on the rear panel of vehicle 32, respectively. The images formed by visible light L1 and visible light L2 and displayed on display panels 11a and 11b are captured by image sensors 21b and 21a as vehicle-installed cameras, respectively.

Because optical communication system 1 includes display panels 11a and 11b having a curved surface as a light emitter as described above, the light emitter is easily disposed even in portions of the outer surfaces of the vehicle having complicated shapes.

Because transparent display panels 11a and 11b are used as the light emitter, a transparent and less visible light emitter is easily installed even in design-oriented portions of the outer surfaces of the vehicle. Such a configuration also enables the light emitter to be installed in places including window glass and a directional indicator lens where a display panel having light shielding properties cannot be installed.

Such a configuration provides an optical communication system which enables relaxation of the limitations on the place for installation of the light emitter.

In the example shown in FIG. 2, a bidirectional communication function between vehicles 31 and 32 is provided by two sets of optical communication systems, which are configured with an optical communication system including display panel 11a and image sensor 21b and another optical communication system including display panel 11b and image sensor 21a. The display panels and the image sensors are also disposed in the rear portion of vehicle 31 and the front portion of vehicle 32 (not illustrated). Such a configuration enables communication with another vehicle such as communication between vehicles in a train of vehicles which travel.

Using optical communication system 1, for example, information signals processed by vehicle-installed electronic control units (information signals indicating the driving operation such as the speed, the acceleration, and steering, and the road conditions such as obstacles to driving) are exchanged between vehicles to assist autonomous driving of vehicles. In this case, the vehicle-installed electronic control unit is one example of the application apparatus described above.

Next, a method of representing an information signal with a light image, that is, a method of modulating a light image by an information signal will be described by way of examples.

Figure 3:
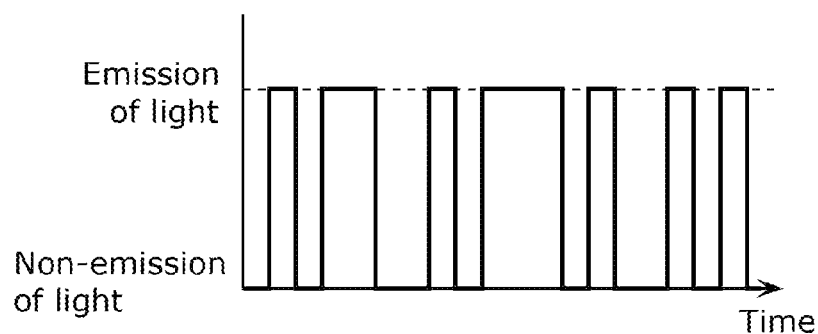
FIG. 3 is a schematic view illustrating one example of modulation according to Embodiment 1.

FIG. 3 is a schematic view illustrating one example of modulation of the intensity of the emitted light by the information signal. The example shown in FIG. 3 schematically represents temporal blinking of display panel 11 according to the information signal. As above, transmission controller 14 may temporally change the intensity of the emitted light in display panel 11 (including blinking) according to the information signal. Transmission controller 14 may blink all the pixels in display panel 11 at the same time.

Thus, optical communication system 1 can communicate by modulating the intensity of the light by the information signal.

Figure 4:
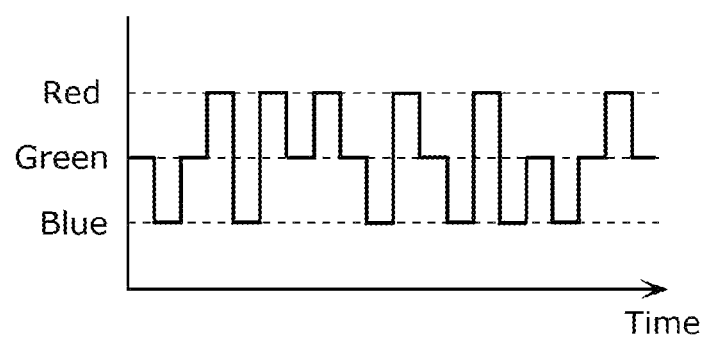
FIG. 4 is a schematic view illustrating one example of modulation according to Embodiment 1.

FIG. 4 is a schematic view illustrating one example of modulation of the color of the emitted light by the information signal. The example shown in FIG. 4 schematically represents the light emission of display panel 11 by the color temporally changed among colors of red, green, and blue according to the information signal. In the case where display panel 11 is a color display panel as described above, transmission controller 14 may temporally change the color of the emitted visible light in display panel 11 according to the information signal. Transmission controller 14 may change the colors of the light rays emitted from all the pixels in display panel 11 at the same time.

Thus, optical communication system 1 can communicate by modulating the color of the light by the information signal.

Figure 5:
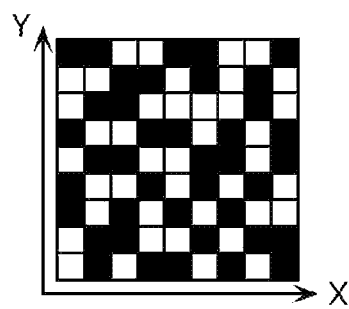
FIG. 5 is a schematic view illustrating one example of modulation according to Embodiment 1.

FIG. 5 is a schematic view illustrating one example of modulation of the pattern of the light image by the information signal. The example shown in FIG. 5 schematically indicates the display of a two-dimensional pattern representing the information signal on display panel 11. Thus, transmission controller 14 may cause display panel 11 to display a two-dimensional code of the encoded information signal in a two-dimensional array including a plurality of pixels which emit light and a plurality of pixels which do not emit light.

Thus, optical communication system 1 can communicate by modulating the pattern of the light image by the information signal.

Figure 6:
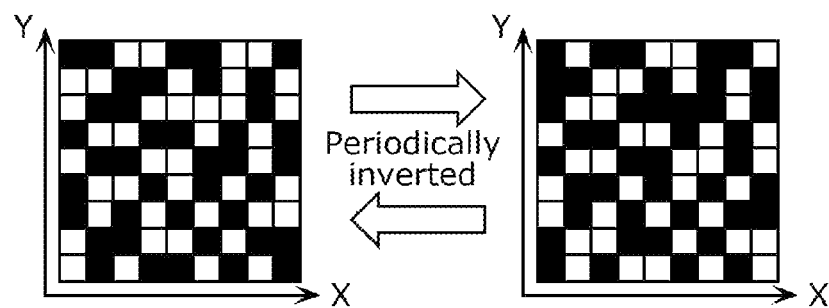
FIG. 6 is a schematic view illustrating one example of display operation according to Embodiment 1.

FIG. 6 is a schematic view illustrating one example of an operation to display the two-dimensional pattern. In the example shown in FIG. 6, transmission controller 14 causes display panel 11 to alternately display the two-dimensional pattern shown in FIG. 5 and its inverted image. Thus, transmission controller 14 may cause display panel 11 to display the two-dimensional code by periodically inverting emission and non-emission of light from the pixels which constitute the two-dimensional code.

In such a configuration, the degree of degradation of the pixels which progresses according to the light emission time can be leveled among the pixels, prolonging the effective life of the display panel.

Next, an application example of an optical communication system which forms the directivity of communication using the curved surface of the display panel will be described.

Figure 7A:
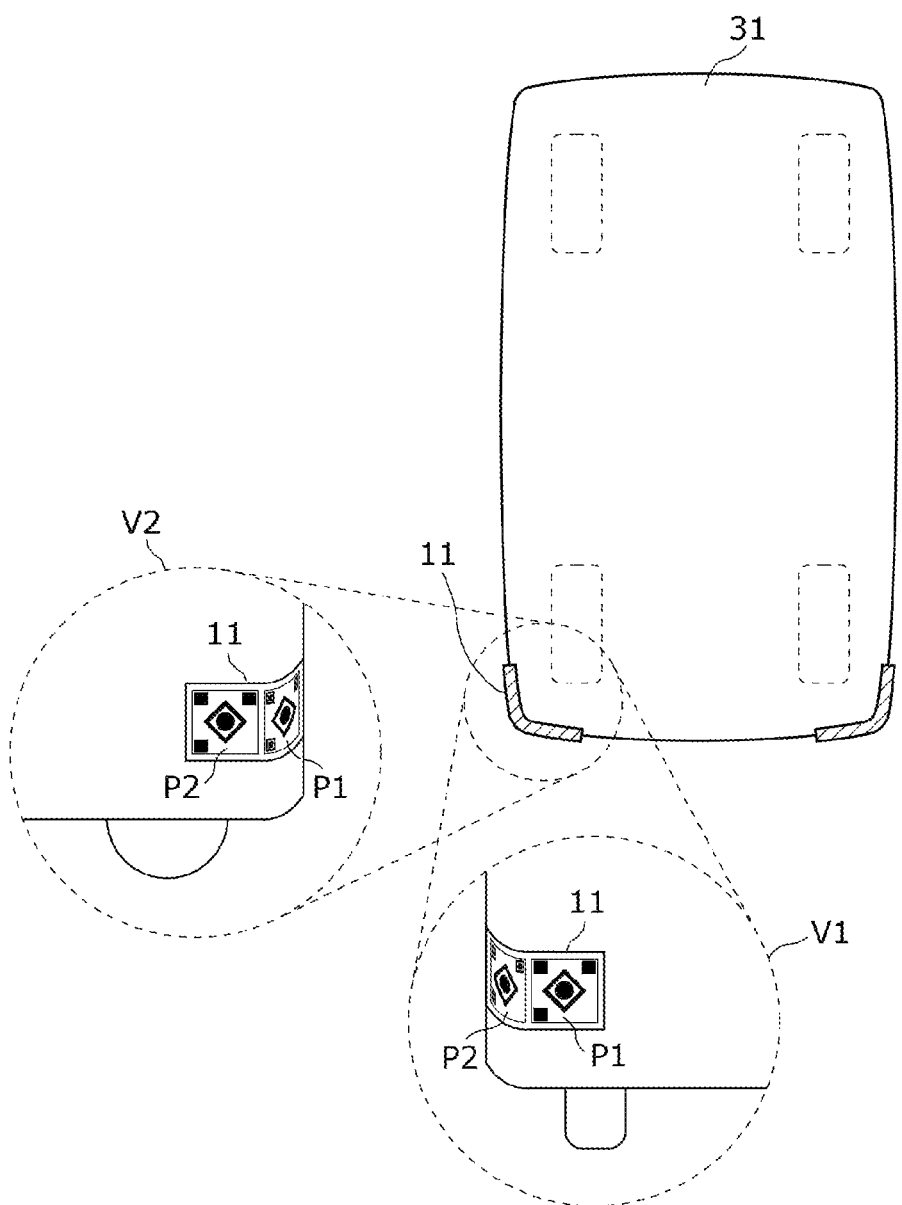
FIG. 7A is a schematic view illustrating one example of formation of directivity according to Embodiment 1.

FIG. 7A is a schematic view illustrating one example of formation of the directivity in communication. In the example shown in FIG. 7A, display panel 11 is disposed such that its surface is curved to be aligned with the body of vehicle 31 from the lateral surface to the front surface of vehicle 31.

Transmission controller 14 (see FIG. 1) displays test patterns P1 and P2 of a predetermined shape in different regions of display panel 11.

Figure 7B:
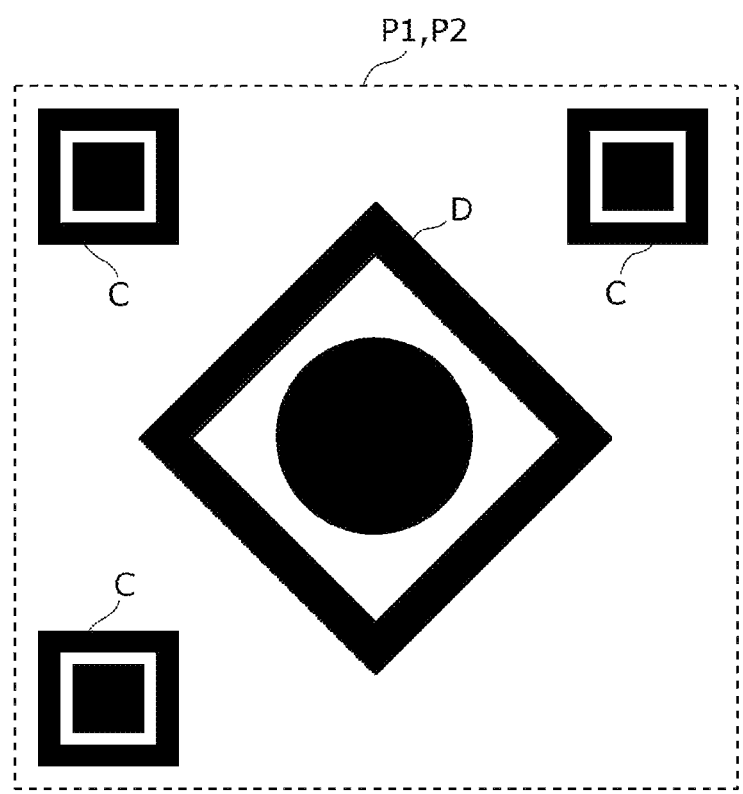
FIG. 7B is a diagram illustrating one example of a test pattern according to Embodiment 1.

FIG. 7B is a plan view illustrating one example of test patterns P1 and P2. As illustrated in FIG. 7B, test patterns P1 and P2 each include corner marks C disposed at three corners of a square region to represent the ends of a reading region and one distortion detection pattern D disposed in the center of the square region. As one example, distortion detection pattern D is configured of an isotropic figure (such as a true circle) surrounded by a polygonal shape (such as a square).

In the example shown in FIG. 7A, test patterns P1 and P2 are disposed in a region of display panel 11 located on the front surface of vehicle 31 and a region thereof located on the lateral surface of vehicle 31, respectively. Front view V1 and side view V2 shown within circles drawn by dotted lines are one examples of test patterns P1 and P2 captured by a vehicle-installed camera disposed in a rear portion of a preceding vehicle running ahead of vehicle 31 and captured by a vehicle-installed camera disposed in a lateral portion of a side vehicle which is running side by side with vehicle 31, respectively.

The vehicle-installed camera of the preceding vehicle faces test pattern P1 (in other words, it is located in the normal direction to a region of display panel 11 in which test pattern P1 is displayed) but does not face test pattern P2. For this reason, test pattern P1 looks square and test pattern P2 looks distorted in front view V1.

The vehicle-installed camera of the side vehicle faces test pattern P2 (in other words, it is located in the normal direction to a region of display panel 11 in which test pattern P2 is displayed) but does not face test pattern P1. For this reason, test pattern P2 looks square and test pattern P1 looks distorted in side view V2.

Utilizing such properties of how the test pattern looks, reception controller 24 of the preceding vehicle and that of the side vehicle each determine whether its image sensor 21 faces the region of display panel 11 in which the test pattern is displayed.

For example, reception controller 24 (see FIG. 1) may store a predetermined shape (the shape shown in FIG. 7B as one example) of the test pattern, and may perform the determination above based on a difference between the shape of the captured test pattern and the stored shape. As one specific example, in the case where each difference in length among the four sides of pattern D and each deviation of the angle formed by two adjacent sides from the right angle in the captured test pattern are less than predetermined threshold values, reception controller 24 may determine that the region in which the test pattern is displayed faces image sensor 21.

By determining the region of display panel 11 which faces image sensor 21 as described above, reception controller 24 extracts the information signal only from the image displayed in the region.

Such an operation enables communication with directivity between the region and the image sensor facing the region for each region of display panel 11, and thus enables space division multiplexing communication between one transmitter and a plurality of receivers based on directivity.

Next, other features of the optical communication system will be described.

Figure 8:
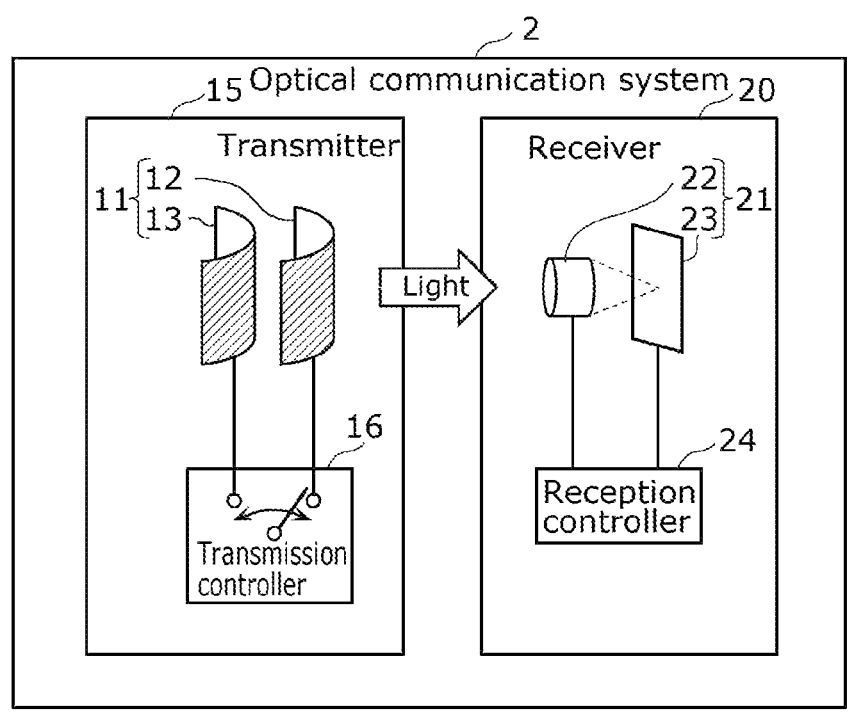
FIG. 8 is a block diagram illustrating another example of a functional configuration of the optical communication system according to Embodiment 1.

FIG. 8 is a block diagram illustrating another example of the functional configuration of the optical communication system. As illustrated in FIG. 8, unlike optical communication system 1 shown in FIG. 1, optical communication system 2 includes dual display panels 11.

In transmitter 15 of optical communication system 2, display panel 11 is configured of transparent organic EL display panels 12 and 13 having a curved surface, display panels 12 and 13 being layered in the light emission direction. Transmission controller 16 causes organic EL display panels 12 and 13 to alternately emit light.

In such a configuration, display panel 11 can have increased reliability by dual organic EL display panels 12 and 13 without increasing the substantial installation area thereof. Moreover, alternate driving of organic EL display panels 12 and 13 can prolong the entire life of display panel 11 configured of organic EL display panels 12 and 13.

Alternatively, display panel 11 may be integrally formed with a member which constitutes an outer surface of the vehicle.

Figure 9:
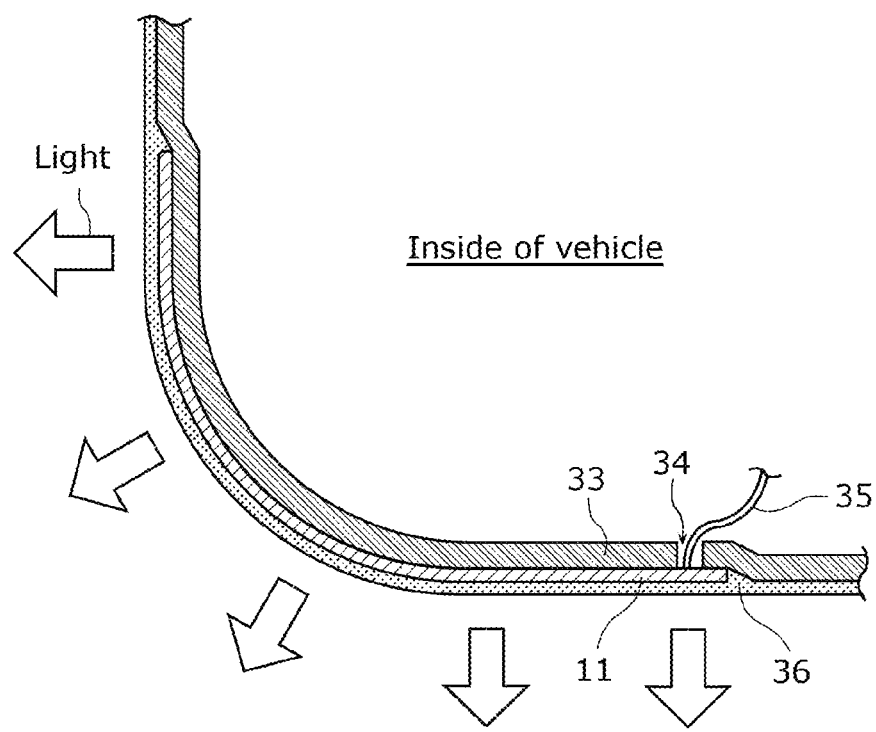
FIG. 9 is a schematic view illustrating one example of the structure for installation of the display panel according to Embodiment 1.

FIG. 9 is a schematic view illustrating one example of the structure for installation of the display panel. In FIG. 9, display panel 11 is a transparent organic EL display panel having a curved surface, and is fixed to member 33 which constitutes an outer surface of the vehicle. The entire surface (light radiating surface) of display panel 11 and at least part of member 33 are covered with transparent resin 36. As described above, member 33 may be a transparent member such as window glass or a directional indicator lens, or may be a steel sheet or a resin plate which constitutes the body of the vehicle.

In such a configuration, utilizing the small thickness of the organic EL display panel, member 33 which constitutes the outer surface of the vehicle can be integrally formed with display panel 11, thus providing an optical communication system which hardly impairs the designability of the vehicle appearance.

Member 33 includes through hole 34 in a position corresponding to the rear surface of display panel 11, and display panel 11 is connected to the transmission controller (see FIG. 1) with cable 35 which passes through hole 34. Cable 35 includes a power supply cable and a signal cable.

Such a configuration facilitates extension of cable 35 which connects display panel 11 and transmission controller, thus providing an optical communication system having high mount properties.

The optical communication system may also include a cleaner disposed in a light radiating direction of display panel 11.

Figure 10:
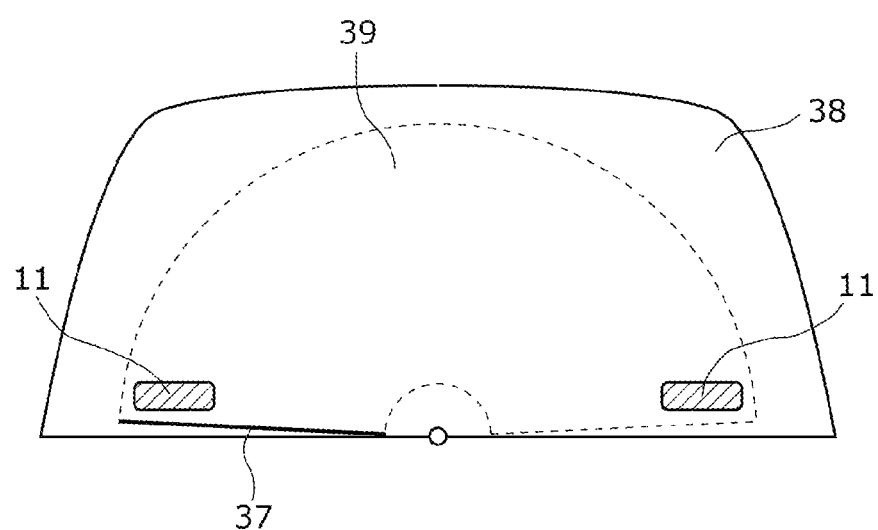
FIG. 10 is a schematic view illustrating one example of the cleaner according to Embodiment 1.

FIG. 10 is a schematic view illustrating a wiper of the vehicle as one example of the cleaner included in the optical communication system. In the example shown in FIG. 10, display panel 11 is a transparent organic EL display panel having a curved surface, and is disposed in region 39 of rear window glass 38 of the vehicle, the region being cleaned by wiper 37.

Such a configuration enables removal of dirt which obstructs the recognition of light radiated from display panel 11, thus facilitating ensuring of the reliability in communication. The cleaner is not limited to the wiper for window glass, and may be a dedicated wiper disposed on the light radiating surface of display panel 11.

Next, another application example of the optical communication system will be described.

Figure 11:
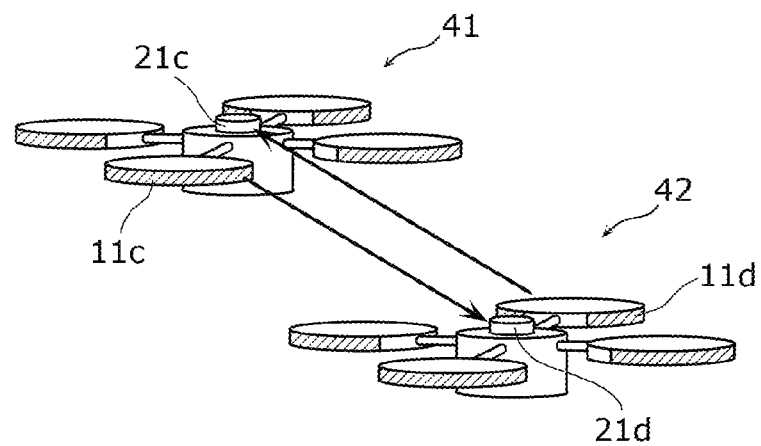
FIG. 11 is a schematic view illustrating another application example of the optical communication system according to Embodiment 1.

FIG. 11 is a schematic view illustrating another application example of the optical communication system, where the optical communication system applied to communication between drones 41 and 42 is shown. As shown in FIG. 11, drone 41 includes display panel 11c and image sensor 21c, and drone 42 includes display panel 11d and image sensor 21d.

Display panels 11c and 11d are each a transparent organic EL display panel having a curved surface, and display images formed by light. Display panels 11c and 11d are installed in the outer circumferences of propeller guards for drones 41 and 42, respectively.

Image sensors 21c and 21d are each an omnidirectional camera, and capture the outer circumferences of drones 41 and 42. Image sensors 21c and 21d are disposed in vertex portions of drones 41 and 42, respectively. The images formed by light and displayed on display panels 11c and 11d are captured by image sensors 21d and 21c, which are omnidirectional cameras, respectively.

Because the optical communication system includes display panels 11c and 11d having a curved surface as light emitters as described above, the light emitter can also be readily installed in a curved portion of the drone, such as a propeller guard. Space division multiplexing communication between drones is enabled by forming the directivity of communication using the curved surface of the display panel as described above.

For example, automatic operation of drones can be assisted by exchanging information signals among the drones through the optical communication system, the information signals representing the flight conditions such as the speed, the altitude, the acceleration, and the traveling direction and being processed by the electronic control units of the drones.

Figure 12:
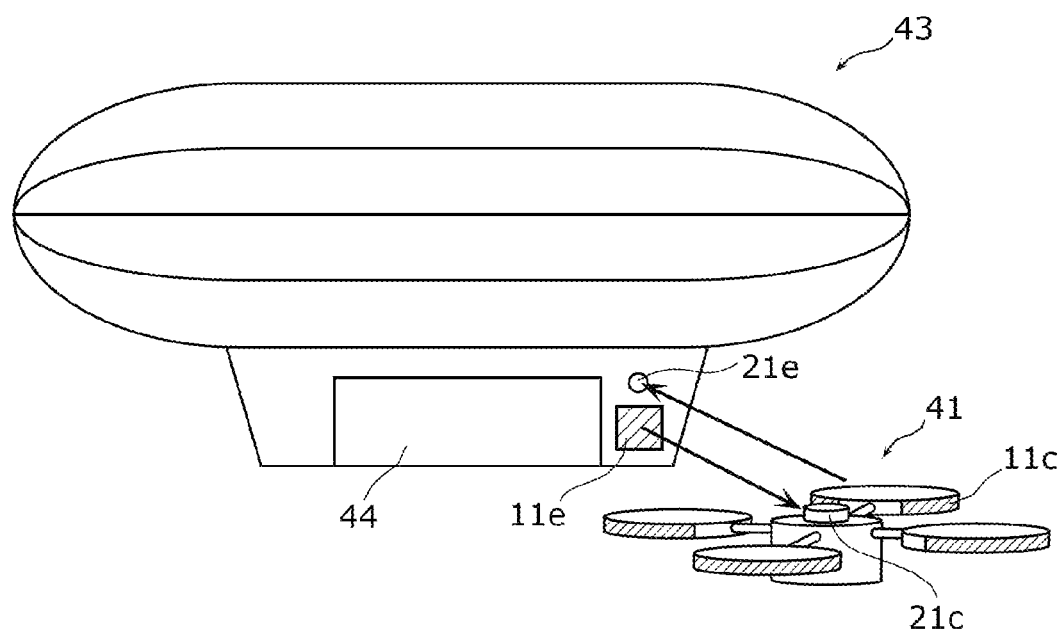
FIG. 12 is a schematic view illustrating further another application example of the optical communication system according to Embodiment 1.

FIG. 12 is a schematic view illustrating another application example of the optical communication system, where the optical communication system applied to communication between drone 41 and airship 43 is shown. As shown in FIG. 12, drone 41 includes display panel 11c and image sensor 21c, and airship 43 includes display panel 11e and image sensor 21e.

Drone 41 and airship 43 may form a logistics system, for example. Airship 43 may transport packages through main routes which connect relay points, and drone 41 may transport through terminal routes which connect between airship 43 and distribution points and package collection points. Drone 41 may enter airship 43 from hatch 44 to load and unload the packages.

Using the optical communication system, information signals representing the distribution points, the package collection points, the dimension of the package, the weight, and the number of packages are exchanged between airship 43 and drone 41. This enables efficient operation of the logistics system, such as timely assignment of drones to the terminal routes.

Although an exemplary configuration of the optical communication system including an organic EL display panel which emits visible light, as a transmitter, and an image sensor which receives visible light emitted from the display panel, as a receiver, has been described in Embodiment 1, the light fed in communication can have any wavelength other than that of visible light. For example, a display panel which emits infrared light and an image sensor which can receive the infrared light may be used, or a display panel which emits ultraviolet light and an image sensor which can receive the ultraviolet light may be used. The light wavelength region is not limited to those of infrared light, visible light, and ultraviolet light. The effects of the present disclosure can be provided by a combination of two-dimensional arrays of a light emitter as a transmitter and two-dimensional arrays of a sensor which can receive its corresponding emitted light.

Embodiment 2

The optical communication system according to Embodiment 2 will be described. The optical communication system according to the present embodiment can be used to reduce false recognition in traditional image authentication systems. The traditional image authentication systems such as autonomous vehicles and face authentication systems have relatively high risks of false recognition because objects are recognized based on only the appearances of the objects contained in images obtained by image sensors. The optical communication system according to the present embodiment has risks of false recognition reduced by transmitting information for authentication of the object from a display panel attached to the object to the image sensor through optical communication. Differences of the optical communication system according to the present embodiment from the optical communication system according to Embodiment 1 will be mainly described with reference to FIGS. 13 and 14.

Figure 13:
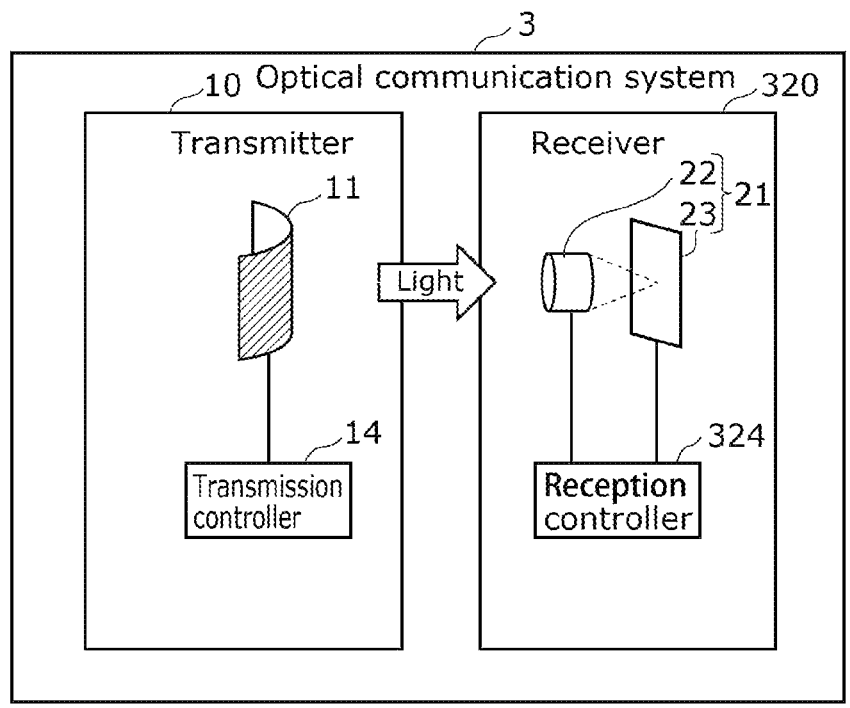
FIG. 13 is a block diagram illustrating a functional configuration of the optical communication system according to Embodiment 2.

FIG. 13 is a block diagram illustrating a functional configuration of optical communication system 3 according to the present embodiment. As illustrated in FIG. 13, optical communication system 3 functionally includes transmitter 10 including display panel 11 and transmission controller 14, and receiver 320 including image sensor 21 and reception controller 324.

Reception controller 324 according to the present embodiment extracts an information signal from the light received by image sensor 21, which receives light emitted from display panel 11, and performs image authentication of the object to which display panel 11 is attached. In the present embodiment, reception controller 324 obtains the image of the object, to which display panel 11 is attached, from image sensor 21, and performs authentication of the object based on the image. The object can be any object, and examples thereof include a person, an animal, and a car. For example, the type of the object such as a person or an animal may be authenticated or a specific person may be authenticated by image authentication. Alternatively, reception controller 324 may perform image authentication using image data. Receiver 320 may include a storage which stores data used in image authentication.

In the present embodiment, the information signal extracted from light by reception controller 324 includes the attribute information of the object. For example, the attribute information may be a signal indicating the information concerning the kind of the object such as a person or an animal, may be information such as the age, the sex, or the name, or may be a signal indicating authentication information such as identification information for specifying an individual.

Figure 14:
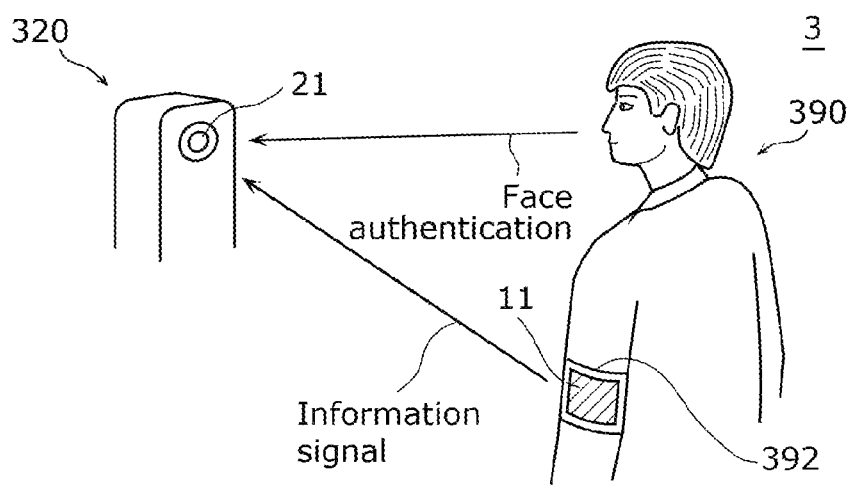
FIG. 14 is a schematic view illustrating an application example of the optical communication system according to Embodiment 2.

An application example of optical communication system 3 according to the present embodiment will be described with reference to FIG. 14. FIG. 14 is a schematic view illustrating an application example of optical communication system 3 according to the present embodiment. As illustrated in FIG. 14, optical communication system 3 according to the present embodiment is applied to face authentication of person 390. In the application example illustrated in FIG. 14, display panel 11 is attached to person 390, who is the object subjected to authentication. Display panel 11 is attached to arm band 392 wound around an arm of person 390. Although not illustrated in FIG. 14, arm band 392 includes transmission controller 14. In other words, arm band 392 constitutes transmitter 10.

Receiver 320 illustrated in FIG. 14 performs face authentication of person 390. In the application example illustrated in FIG. 14, receiver 320 has a housing-like outer shape, and includes image sensor 21 disposed on the outer surface thereof. Although not illustrated in FIG. 14, receiver 320 includes reception controller 324 illustrated in FIG. 13. Reception controller 324 obtains the image of person 390, who is the object to which display panel 11 is attached, from image sensor 21, and performs authentication of person 390 based on the image. Specifically, based on the image, reception controller 324 specifies who person 390 is.

Display panel 11 according to the present embodiment emits light representing an information signal including individual authentication information for specifying person 390. In other words, reception controller 324 extracts the individual authentication information for specifying person 390 from the light emitted from display panel 11 and received by image sensor 21.

In the application example illustrated in FIG. 14, the risk of false recognition is increased in the case where the image obtained by reception controller 324 is not suitable for image authentication. Examples of the case where the image is not suitable for image authentication include low-quality images, and images including only part of the face of person 390. However, in the present embodiment, display panel 11 attached to person 390 can emit light representing the information signal including the individual authentication information, and reception controller 324 can extract the individual authentication information from the light received by image sensor 21. For this reason, person 390 can be precisely authenticated even when false authentication may occur in face authentication.

As described above, optical communication system 3 according to the present embodiment can enhance the precision of image authentication compared to that of the traditional image authentication systems. Moreover, in optical communication system 3 according to the present embodiment, it is sufficient that the light emitted by display panel 11 can be received by image sensor 21 and it is not always necessary that the light is recognizable by the person. For this reason, display panel 11 may emit visible light including the information signal for a short time such that the visible light cannot be recognized by the eyes of the person, while emitting visible light which looks like only a pattern to the eyes of the person. Thus, display panel 11 which looks like part of a cloth or an accessory, for example, to the eyes of the person can emit visible light including the information signal.

Although optical communication system 3 according to the present embodiment includes one image sensor 21, optical communication system 3 according to the present embodiment may include a first image sensor which receives light from display panel 11, and a second image sensor which obtains the image of the object.

Embodiment 3

The optical communication system according to Embodiment 3 will be described. The optical communication system according to the present embodiment can be used as an individual authentication system where spoofing is difficult. Differences of the optical communication system according to the present embodiment from the optical communication system according to Embodiment 1 will be mainly described with reference to FIGS. 15 and 16.

Figure 15:
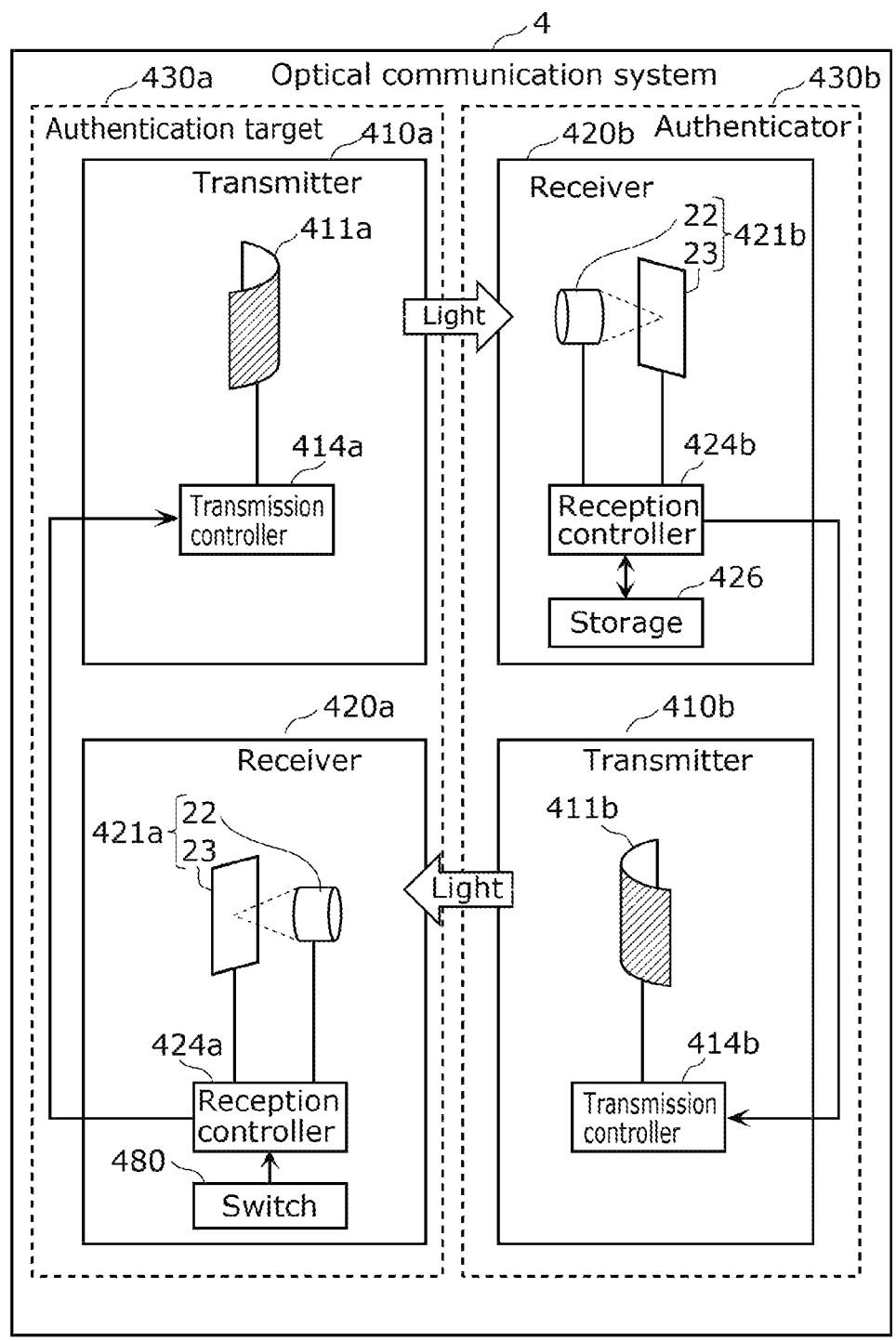
FIG. 15 is a block diagram illustrating a functional configuration of the optical communication system according to Embodiment 3.

FIG. 15 is a block diagram illustrating the functional configuration of optical communication system 4 according to the present embodiment. As illustrated in FIG. 15, optical communication system 4 functionally includes authentication target 430a and authenticator 430b.

Authentication target 430a is the object authenticated by authenticator 430b, and includes transmitter 410a and receiver 420a.

Receiver 420a is a functional unit which receives light from authenticator 430b, and includes image sensor 421a and reception controller 424a. In the present embodiment, receiver 420a further includes switch 480.

Image sensor 421a has the same configuration as that of image sensor 21 according to Embodiment 1. In the present embodiment, image sensor 421a receives light emitted from authenticator 430b, the light corresponding to a challenge signal. Here, the challenge signal indicates a signal used by authenticator 430b for authentication of authentication target 430a, and is transmitted from authenticator 430b to authentication target 430a. The challenge signal can have any configuration. As the challenge signal, a random character string generated for every authentication can be used, for example.

To be noted, image sensor 421a can be any image sensor which can receive the signal output from authenticator 430b. For example, in the case where an infrared signal is output by authenticator 430b, image sensor 421a may be an infrared sensor.

Reception controller 424a has the same function as that of image sensor 21 according to Embodiment 1. In the present embodiment, reception controller 424a extracts a challenge signal from the light which is emitted from authenticator 430b, and further generates a response signal corresponding to the extracted challenge signal. Reception controller 424a outputs the generated response signal to transmitter 410a. The response signal is a signal generated based on the challenge signal. The response signal is generated, for example, by performing undisclosed predetermined processing on the challenge signal. The response signal can be used as a one-time password for authentication of authentication target 430a by authenticator 430b because the predetermined processing is shared by authentication target 430a and authenticator 430b. The predetermined processing can be any processing. For example, the predetermined processing may be processing which performs an arithmetic operation on the numeric value corresponding to a character string.

Switch 480 is an operator which starts and stops the operation of receiver 420a. Such a configuration enables the user to operate receiver 420a only during authentication. For example, in the case where the person holds authentication target 430a, this configuration can reduce a risk of invading the privacy, which may be caused by obtaining unnecessary images in occasions other than authentication.

Transmitter 410a includes display panel 411a and transmission controller 414a. Display panel 411a and transmission controller 414a have the same configurations as those of display panel 11 and transmission controller 14 according to Embodiment 1. Transmission controller 414a according to the present embodiment receives the response signal from receiver 420a, and displays the light image corresponding to the response signal on display panel 411a. Transmitter 410a may transmit a signal of requesting authentication to authenticator 430b to start authentication by authenticator 430b.

Authenticator 430b is a processor which authenticates authentication target 430a, and includes transmitter 410b and receiver 420b.

Receiver 420b is a functional unit which receives light from authentication target 430a, and includes image sensor 421b and reception controller 424b. In the present embodiment, receiver 420b further includes storage 426.

Image sensor 421b has the same configuration as that of image sensor 21 according to Embodiment 1. In the present embodiment, image sensor 421b receives the light corresponding to the response signal, the light being emitted from authentication target 430a.

Reception controller 424b has the same function as that of image sensor 21 according to Embodiment 1. In the present embodiment, reception controller 424b further extracts the response signal from the light which is emitted from authentication target 430a, and performs authentication of authentication target 430a based on the extracted response signal. Specifically, reception controller 424b determines whether the extracted response signal corresponds to the challenge signal transmitted from authenticator 430b, thereby determining whether authentication target 430a is authorized. For example, reception controller 424b may generate a response signal by subjecting the challenge signal to the processing equivalent to the predetermined processing performed in reception controller 424a of authentication target 430a, and may determine that authentication target 430a is authorized by authenticator 430b, only when the generated response signal is equal to the extracted response signal.

In the present embodiment, reception controller 424b obtains an image of an object, to which authentication target 430a is attached, from image sensor 421b to perform authentication of the object based on the image. In the present embodiment, thus, authentication target 430a is authenticated with a one-time password of a challenge and response type, and the object to which authentication target 430a is attached is authenticated by image authentication. For this reason, authentication target 430a and the object are each authenticated, and the appropriateness of the combination thereof can also be authenticated. For example, in the case where authentication target 430a is attached to an object different from the authorized object, it can be determined that such a combination of authentication target 430a and the different object is not authorized. Thus, optical communication system 4 according to the present embodiment can reduce authorization of spoofing by mistake compared to traditional authentication systems.

Reception controller 424b may receive an authentication request signal transmitted from authentication target 430a to start authentication based on the signal. Alternatively, reception controller 424b may start authentication in the case where image sensor 421b receives the light corresponding to the image of authentication target 430a. For example, reception controller 424b may start authentication in the case where image sensor 421b receives the light corresponding to the image on display panel 411a of authentication target 430a. When authenticator 430b starts authentication, reception controller 424b outputs the challenge signal to transmitter 410b.

Storage 426 stores the information needed for authentication. Storage 426 stores the image of the authorized object needed for image authentication. Storage 426 may also store the information needed to generate the response signal.

Transmitter 410b includes display panel 411b and transmission controller 414b.

Display panel 411b and transmission controller 414b have the same configurations as those of display panel 11 and transmission controller 14 according to Embodiment 1, respectively. Transmission controller 414b according to the present embodiment receives the challenge signal from receiver 420b to display a light image corresponding to the challenge signal on display panel 411b. To be noted, display panel 411b does not always have the same configuration as that of display panel 11 according to Embodiment 1. For example, display panel 411b may be a planar display panel. Display panel 411b may transmit the signal using a method other than the above-mentioned light. For example, display panel 411b may transmit the signal using infrared rays or the like. In this case, receiver 420a of authentication target 430a may have the configuration corresponding to that of display panel 411b.

Figure 16:
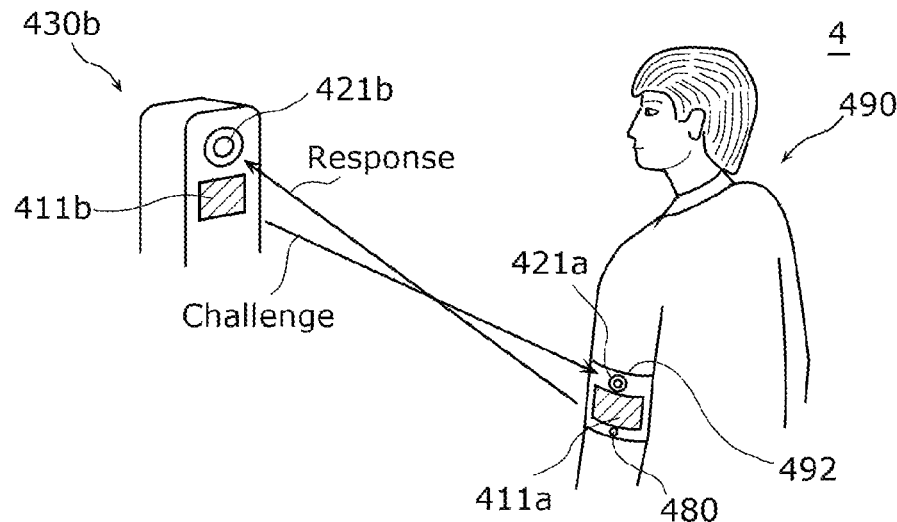
FIG. 16 is a schematic view illustrating an application example of the optical communication system according to Embodiment 3.

Next, an application example of optical communication system 4 according to the present embodiment will be described with reference to FIG. 16. FIG. 16 is a schematic view illustrating an application example of optical communication system 4 according to the present embodiment. Optical communication system 4 according to the present embodiment can be applied to an individual authentication system which is disposed at an entrance gate of a facility where the entry to the facility is restricted, to perform authentication of person 490. In the example illustrated in FIG. 16, authenticator 430b of optical communication system 4 has a housing-like outer shape, and includes image sensor 421b disposed on the outer surface of authenticator 430b, and display panel 411b. Although not illustrated in FIG. 16, authenticator 430b includes reception controller 424b and transmission controller 414b, which are illustrated in FIG. 15.

In the application example illustrated in FIG. 16, authentication target 430a is attached to person 490, who is the object subjected to authentication. Authentication target 430a is attached to arm band 492 wound around an arm of person 490. As illustrated in FIG. 16, the surface of arm band 492 includes display panel 411a, image sensor 421a, and switch 480. Although not illustrated in FIG. 16, arm band 492 includes transmission controller 414a and reception controller 424a, which are illustrated in FIG. 15.

Figure 17:
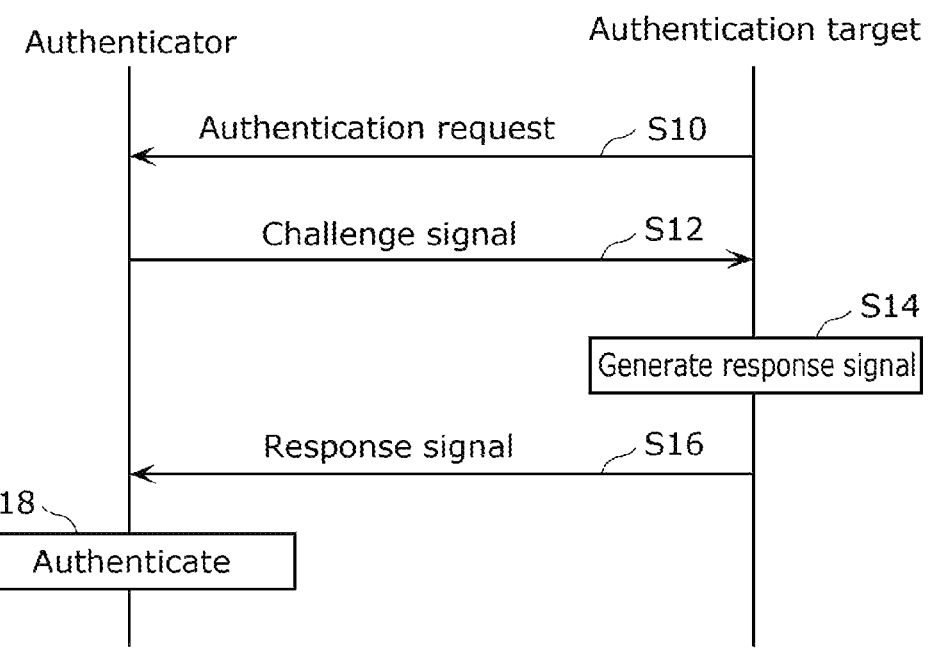
FIG. 17 is a sequence chart illustrating a flow of the authentication method in the optical communication system according to Embodiment 3.

Next, the authentication method for optical communication system 4 according to the present embodiment will be described with reference to FIGS. 16 and 17. FIG. 17 is a sequence chart illustrating a flow of the authentication method for optical communication system 4 according to the present embodiment.

In optical communication system 4 illustrated in FIG. 16, first, authentication target 430a performs authentication request (S10). Specifically, person 490 approaches authenticator 430b of the entrance gate of the facility, and places display panel 411a of authentication target 430a to a position which can be viewed from authenticator 430b. Such placement of display panel 411a to the position which can be viewed from authenticator 430b is one example of the authentication request. Authenticator 430b obtains the image on display panel 411a disposed in arm band 492 put on person 490. Thereby, reception controller 424b of authenticator 430b determines that the authentication request is received.

Subsequently, authenticator 430b, which receives the request, transmits the challenge signal to authentication target 430a (S12). Specifically, the challenge signal generated by reception controller 424b is transmitted to transmission controller 414b of transmitter 410b, and transmission controller 414b causes display panel 411b to display the light image corresponding to the challenge signal.

Subsequently, image sensor 421a of authentication target 430a receives the light emitted from display panel 411b. Reception controller 424a extracts the challenge signal from the light, which is received from image sensor 421a, to generate a response signal corresponding to the challenge signal (S14). Reception controller 424a outputs the generated response signal to transmission controller 414a.

Subsequently, authentication target 430a transmits the response signal to authenticator 430b (S16). Specifically, transmission controller 414a of authentication target 430a causes display panel 411a to display the light image corresponding to the response signal.

Authenticator 430b receives the response signal to perform authentication of authentication target 430a (S18). Specifically, image sensor 421b of authenticator 430b receives the light from display panel 411a. Reception controller 424b of authenticator 430b extracts the response signal from the light which is received by display panel 411a, and determines whether two response signals, i.e., the extracted response signal and the response signal corresponding to the challenge signal transmitted by authenticator 430b are matched. Authenticator 430b determines that authentication target 430a is authorized by authenticator 430b in the case where the two response signals are matched, and determines that authentication target 430a is not authorized by authenticator 430b in the case where the two response signals are not matched.

In addition to the processing described above, authenticator 430b according to the present embodiment performs image authentication of person 490 to which authentication target 430a is attached. For example, authentication target 430a performs face authentication of person 490. Specifically, reception controller 424b of authenticator 430b determines whether the image of the face of person 490 obtained by image sensor 421b matches the image of the face of person 490 which is stored in storage 426 and corresponds to authentication target 430a. When reception controller 424b determines that the two images match, it is determined that person 490 is authorized by authenticator 430b. When reception controller 424b determines that the two images do not match, it is determined that person 490 is not authorized by authenticator 430b. In authenticator 430b, the image authentication processing and the processing illustrated in FIG. 17 may be performed at the same time, or may be performed sequentially.

Thus, the optical communication system according to the present embodiment can reduce authorization of spoofing by mistake.

Embodiment 4

The optical communication system according to Embodiment 4 will be described. Unlike the optical communication system according to Embodiment 1, the optical communication system according to the present embodiment includes an image capturer which captures an image around the system. Hereinafter, the differences of the optical communication system according to the present embodiment from the optical communication system according to Embodiment 1 will be mainly described with reference to FIGS. 18 and 19.

Figure 18:
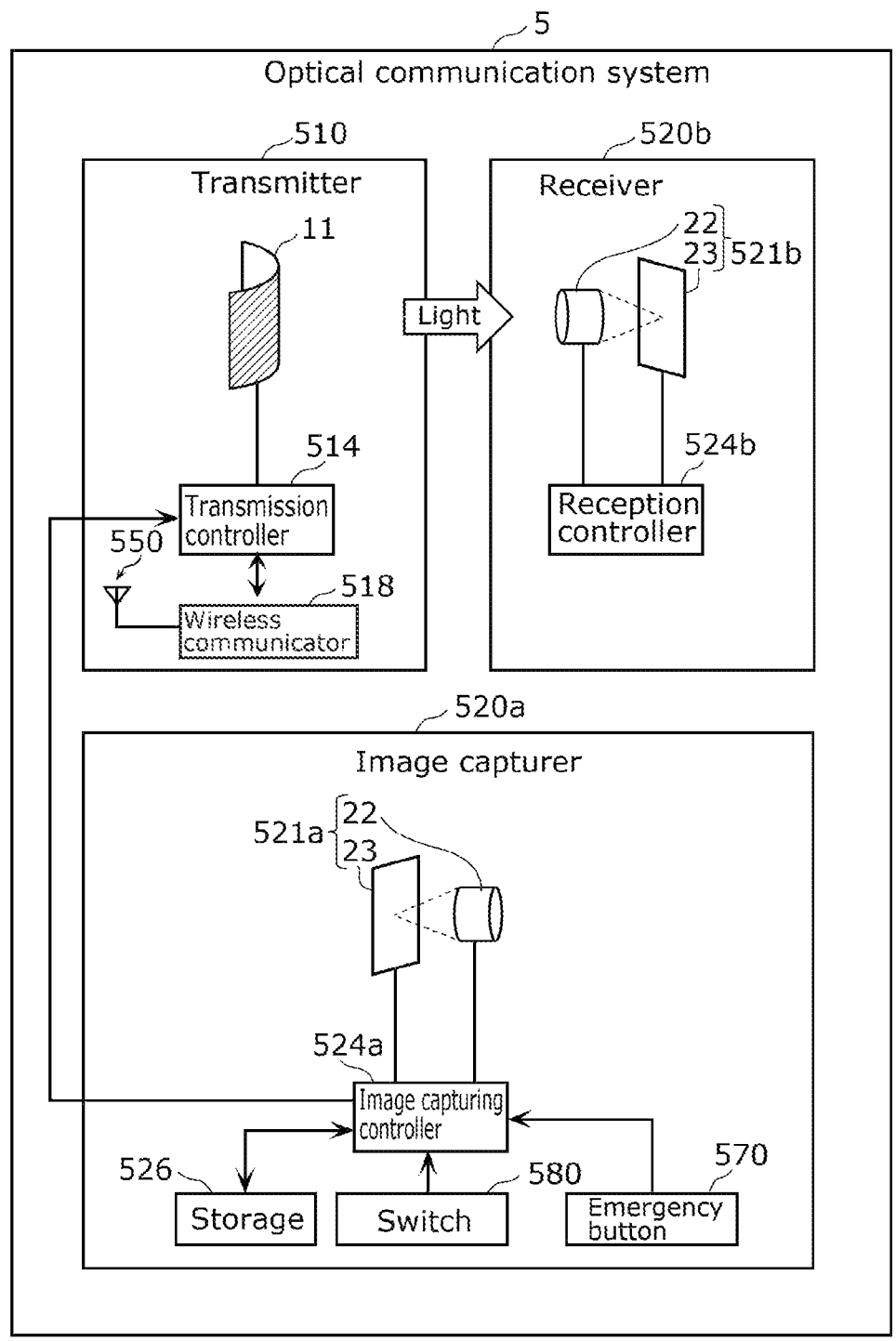
FIG. 18 is a block diagram illustrating a functional configuration of the optical communication system according to Embodiment 4.

FIG. 18 is a block diagram illustrating the functional configuration of optical communication system 5 according to the present embodiment. As illustrated in FIG. 18, optical communication system 5 functionally includes transmitter 510, receiver 520b, and image capturer 520a.

Receiver 520b includes image sensor 521b and reception controller 524b. Image sensor 521b and reception controller 524b have the same configurations as those of image sensor 21 and reception controller 24 according to Embodiment 1, respectively.

Image capturer 520a includes image sensor 521a for image capturing and image capturing controller 524a. In the present embodiment, image capturer 520a further includes storage 526, switch 580, and emergency button 570.

Image sensor 521a for image capturing is a sensor which captures an image. In the present embodiment, image sensor 521a for image capturing receives light as image sensor 21 according to Embodiment 1 does, and includes optical system 22 and image capturing element 23. Although image sensor 521a for image capturing receives light in the present embodiment, image sensor 521a for image capturing, which captures an image, can have any configuration other than that described above. Image sensor 521a for image capturing which captures an image may be any sensor which captures an image, and may be a sensor which receives infrared rays, for example.

Image capturing controller 524a is a processor which controls image sensor 521a for image capturing. In the present embodiment, from emergency button 570, image capturing controller 524a receives a signal indicating that emergency button 570 is pressed, and stores data indicating the image captured by image sensor 521a for image capturing in storage 526. Image capturing controller 524a outputs a signal indicating the captured image to transmitter 510, and causes transmitter 510 to transmit the signal to the outside. In such a configuration, images captured in emergency can be stored, and can be transmitted to the outside.

Image capturing controller 524a starts or stops the operation in response to a signal from switch 580. In other words, image capturing controller 524a starts the operation after a signal indicating the start of the operation is input from switch 580 to image capturing controller 524a, and stops the operation after a signal indicating the stop of the operation is input from switch 580 to image capturing controller 524a.

Storage 526 stores a signal corresponding to the image captured by image sensor 521a for image capturing.

Switch 580 is an operator for starting and stopping the operation of image capturer 520a. Thereby, the user can operate image capturer 520a only when needed. For example, in the case where a person holds image capturer 520a, such a configuration can reduce a risk of invading the privacy of the person, which may be caused by capturing unnecessary images.

Emergency button 570 is an operator which is assumed to be operated in emergency. A signal indicating that emergency button 570 is pressed is output to image capturing controller 524a.

Transmitter 510 includes display panel 11 and transmission controller 514. In the present embodiment, transmitter 510 further includes wireless communicator 518 and antenna 550.

Transmission controller 514 has the same function as that of transmission controller 14 according to Embodiment 1. Transmission controller 514 according to the present embodiment further outputs the signal input from image capturer 520a to wireless communicator 518. Transmission controller 514 may also cause display panel 11 to display an image corresponding to the signal input from wireless communicator 518.

Wireless communicator 518 is a communicator which transmits a signal using radio waves. In the present embodiment, wireless communicator 518 transmits a signal corresponding to the image captured by image sensor 521a for image capturing. Wireless communicator 518 communicates with the outside of transmitter 510. For example, wireless communicator 518 may communicate with receiver 520b. In this case, receiver 520b may include a wireless communicator identical to wireless communicator 518. Wireless communicator 518 may also communicate with the outside of optical communication system 5. For example, wireless communicator 518 may wirelessly communicate with a server disposed external to optical communication system 5. Wireless communicator 518 may also receive a global positioning system (GPS) signal. Thereby, wireless communicator 518 can obtain a signal indicating the current location.

Antenna 550 is an appliance which transmits and receives radio waves. In the present embodiment, antenna 550 generates radio waves containing a signal from wireless communicator 518, and receives radio waves from the outside.

Figure 19:
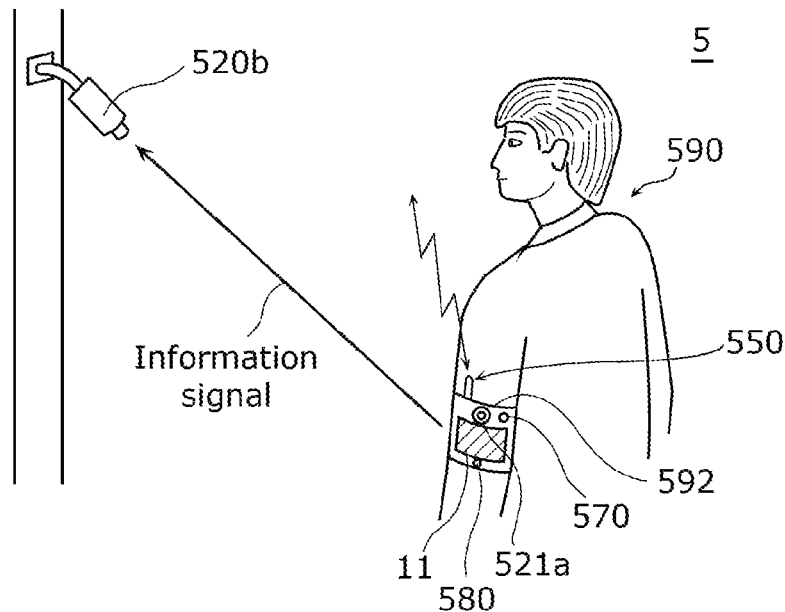
FIG. 19 is a schematic view illustrating an application example of the optical communication system according to Embodiment 4.

Next, an application example of optical communication system 5 according to the present embodiment will be described with reference to FIG. 19. FIG. 19 is a schematic view illustrating an application example of optical communication system 5 according to the present embodiment. Optical communication system 5 according to the present embodiment can be applied to an observation system which observes the behavior of person 590. In the example illustrated in FIG. 19, receiver 520b of optical communication system 5 is implemented as a monitoring camera disposed in a structured body such as a power pole. Although not illustrated in FIG. 19, receiver 520b includes image sensor 521b and reception controller 524b illustrated in FIG. 18.

In the application example illustrated in FIG. 19, display panel 11 is attached to person 590 as the object to be observed. Display panel 11 is attached to arm band 592 wound around an arm of person 590. Arm band 592 includes switch 580 and emergency button 570. Although not illustrated in FIG. 19, arm band 592 includes transmission controller 14. In other words, arm band 592 constitutes transmitter 510.

Receiver 520b illustrated in FIG. 19 performs authentication of person 590. Display panel 11 attached to person 590 emits light representing an information signal including individual authentication information for specifying person 590. Reception controller 324 of receiver 520b obtains an image on display panel 11 from image sensor 521b of receiver 520b to perform authentication of person 590 based on the image. Specifically, based on the image, reception controller 524b specifies who person 590 is. Receiver 520b observes person 590 thus specified. Specifically, by authentication of person 590, receiver 520b knows that the current location of person 590 is near receiver 520b. Optical communication system 5 may include a plurality of receivers 520b. The current location of person 590 can be more specifically known by disposing such a plurality of receivers 520b in different places in an activity region of person 590.

In the case where wireless communicator 518 of transmitter 510 receives a GPS signal, wireless communicator 518 may periodically transmit a signal corresponding to the GPS signal to the outside.

Moreover, transmitter 510 may transmit a signal representing an image captured by image capturer 520a to the outside. Thereby, the image can be used to specify the current location of person 590 even when the current location of person 590 cannot be verified by receiver 520b. The capturing of the image by image capturer 520a can be appropriately stopped by use of switch 580 by person 590. For this reason, the privacy of person 590 can be protected.

Moreover, optical communication system 5 according to the present embodiment can be used to rescue person 590 in emergency. For example, in the case where person 590 is attacked by a thug, person 590 may press emergency button 570. Thereby, image capturer 520a can start capturing of the image of the thug, store the data indicating the image in storage 526, and transmit a signal representing the image from transmitter 510 to the outside. The signal representing the image may be transmitted to a security company or the police, for example. At this time, information such as attributes of person 590 and the signal corresponding to the GPS signal may also be transmitted in addition to the signal representing the image. The image may be displayed on display panel 11. Thereby, receiver 520b can obtain the image. Additionally, the thug may stop the attack when the thug notices that the image thereof is being captured. When emergency button 570 is pressed, image capturing controller 524a may transmit a signal indicating a state of emergency from transmitter 510 to the outside. When emergency button 570 is pressed, the security company may transmit a signal, which represents an image which may threaten the thug, to transmitter 510, the image including an image of a security officer who is heading to the location in target and an image of the security officer. Display of these images on display panel 11 may prompt the thug to stop the attack. To be noted, the images stored in storage 526 can be used to specify the thug.

Thus, optical communication system 5 according to the present embodiment can be provided as a system which observes person 590 while the privacy of person 590 is protected.

Embodiment 5

The optical communication system according to Embodiment 5 will be described. The optical communication system according to the present embodiment is an optical communication system according to Embodiment 1 applied to a robot. The optical communication system according to the present embodiment will now be described with reference to FIG. 20.

Figure 20:
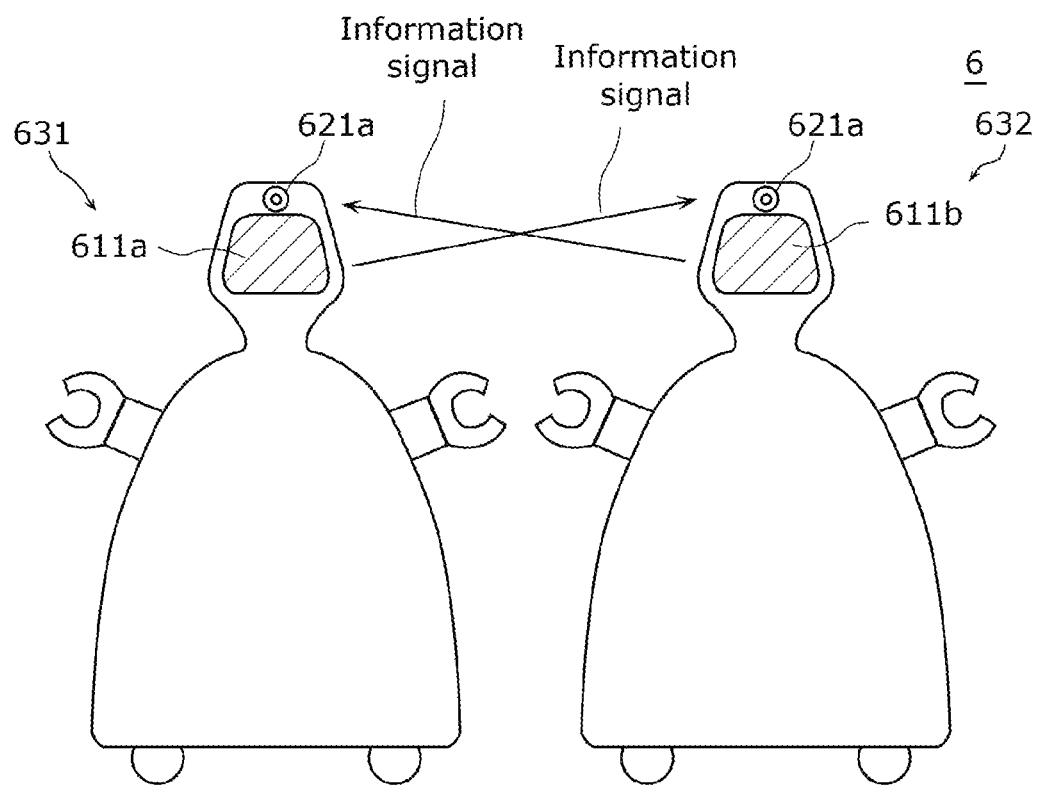
FIG. 20 is a schematic view illustrating an application example of the optical communication system according to Embodiment 5.

FIG. 20 is a schematic view illustrating an application example of optical communication system 6 according to the present embodiment. Optical communication system 6 according to the present embodiment is included in robots 631 and 632. Although robots 631 and 632 are not particularly limited, for example, these robots can perform predetermined jobs and freely move. As illustrated in FIG. 20, robot 631 includes display panel 611a and image sensor 621a, and robot 632 includes display panel 611b and image sensor 621b.

Display panels 611a and 611b have the same configuration as that of display panel 11 according to Embodiment 1. Display panels 611a and 611b are controlled by transmission controllers identical to the transmission controller according to Embodiment 1. The transmission controller is disposed inside each robot, for example.

Image sensors 621a and 621b have the same configuration as that of image sensor 21 according to Embodiment 1. Image sensors 621a and 621b are controlled by reception controllers identical to the reception controller according to Embodiment 1. The reception controller is disposed inside each robot, for example.

Optical communication system 5 illustrated in FIG. 20 includes two sets of optical communication systems, which are configured of an optical communication system including display panel 611a and image sensor 621b and another optical communication system including display panel 611b and image sensor 621a. This provides a bidirectional communication function between robots 631 and 632.

Display panel 611a and display panel 611b display images and/or letters indicating the states of robots 631 and 632. For example, when each robot is moving, letters indicating its destination may be displayed. Thereby, people around the robots can know the states of the robots.

Each display panel may display an image mimicking an expression of a human face as an image indicating the state of each robot. For example, an image showing a stern face expression may be displayed when the working schedule of the robot is tight without in-between time, and an image showing a smiling face may be displayed when the robot works with lead time. Thereby, the state of each robot can be known only by looking at the display panel of the robot. For example, when a person around the robot knows that the robot is in hurry, the person can be careful not to approach the robot. The robots can communicate with each other by optical communication about the states thereof. Because such optical communication can be performed in a short time such that it cannot be recognized by the human eyes, optical communication can be performed while images recognizable by the human eyes are being displayed in the display panels.

Thus, optical communication system 6 according to the present embodiment enables optical communication between robots while images showing the states of the robots are being displayed in the display panels.

Although the optical communication systems according to the embodiments of the present disclosure have been described as above, these individual embodiments should not be construed as limitations to the present disclosure. One or more aspects according to the present disclosure may also cover a variety of modifications of the present embodiments conceived and made by persons skilled in the art and those including combinations of components included in different embodiments without departing from the gist of the present disclosure.

INDUSTRIAL APPLICABILITY

The present disclosure can be used in communication between moving bodies as an optical communication system, for example.

The invention claimed is:
1. An optical communication system, comprising:
a transmitter including a display panel, which has a curved surface and is capable of emitting light, and a transmission controller, which causes the display panel to emit light representing an information signal; and
a receiver including an image sensor, which receives the light emitted from the display panel, and a reception controller, which extracts the information signal from the light received by the image sensor,
wherein the transmitter is provided on a first moving body and the receiver is provided on a second moving body,
the transmission controller causes the display panel to display a first two-dimensional code representing the information signal in a two-dimensional array, the two-dimensional array including pixels which emit light and pixels which do not emit light, and
the reception controller determines, based on a difference between a second shape of a second two-dimensional code captured by the image sensor and a first shape of the first two-dimensional code displayed on the display panel, whether a region of the display panel in which the first two-dimensional code is displayed faces the image sensor.

2. The optical communication system according to claim 1,
wherein the reception controller extracts the information signal only from the two-dimensional code displayed in the region of the display panel determined to face the image sensor.

3. The optical communication system according to claim 1,
wherein the display panel is an organic electroluminescent (EL) display panel.

4. The optical communication system according to claim 3,
wherein
the organic EL display panel is fixed to a member which constitutes an outer surface of the first moving body, and
an entire surface of the organic EL display panel and at least a part of the member are covered with a transparent resin.

5. The optical communication system according to claim 4,
wherein the member includes a through hole in a position corresponding to a rear surface of the organic EL display panel, and
the organic EL display panel is connected to the transmission controller with a cable which extends through the through hole.

6. The optical communication system according to claim 1,
wherein the transmission controller temporally changes intensity of the light emitted by the display panel according to the information signal.

7. The optical communication system according to claim 1,
wherein the display panel is a color display panel which is capable of emitting visible light of a color, and
the transmission controller temporally changes the color of the visible light emitted by the display panel according to the information signal.

8. The optical communication system according to claim 1,
wherein the transmission controller periodically inverts emission and non-emission of light from the pixels in the two-dimensional array, the pixels constituting the two-dimensional code.

9. The optical communication system according to claim 1,
wherein the transmitter is disposed in a first vehicle, and the receiver is disposed in a second vehicle.

10. The optical communication system according to claim 1,
wherein the transmitter is disposed in a first drone, and the receiver is disposed in a second drone.

11. The optical communication system according to claim 1,
wherein one of the transmitter and the receiver is disposed in a drone, and a remaining one of the transmitter and the receiver is disposed in an airship.

12. The optical communication system according to claim 1,
wherein the transmitter further includes a wireless communicator which transmits a signal using radio waves.

13. The optical communication system according to claim 1, further comprising:
a camera including an image sensor for image capturing which captures an image and an image capturing controller which controls the image sensor for image capturing.

14. The optical communication system according to claim 13, wherein the camera further includes a switch for starting and stopping an operation of the camera.

15. The optical communication system according to claim 1,
wherein the two-dimensional code includes a test pattern having a predetermined shape, and
the reception controller stores a third shape of the test pattern, and determines, based on a difference between a fourth shape of the test pattern captured by the image sensor and the third shape of the test pattern, which is store by the controller, whether the region of the display panel in which the two-dimensional code is displayed faces the image sensor.

* * * * *